United States Patent [19]

Stock

[11] Patent Number: 4,818,617

[45] Date of Patent: Apr. 4, 1989

[54] METHOD AND MATERIAL FOR CHECKING DRILLED PRINTED CIRCUIT BOARDS

[76] Inventor: Larry A. Stock, Box 2810, Olympic Valley, Calif. 95730

[21] Appl. No.: 896,472

[22] Filed: Aug. 14, 1986

[51] Int. Cl.⁴ ............................................. B32B 27/36
[52] U.S. Cl. .................................... 428/412; 428/480; 428/462; 428/522; 33/563
[58] Field of Search .................. 33/563; 428/462, 522, 428/412, 480

[56] References Cited

U.S. PATENT DOCUMENTS 3,932,689  1/1976  Watanabe et al. .................. 428/462
4,172,553  10/1979  Feather et al. ........................ 33/563

*Primary Examiner*—Edith Buffalow
*Attorney, Agent, or Firm*—Townsend & Townsend

[57] ABSTRACT

A method and material are provided for checking the location of holes drilled in copper-coated printed circuit boards. The material is a translucent, dimensionally stable plastic sheet having a blue-green or yellow-green color and a light transmissivity in the range from about 25 to 40%. The use of this particular material has been found to provide optimum contrast between a dark background created when the material overlays the copper printed circuit board, and transmitted light and light reflected from the copper surface when the holes on the printed circuit board are misaligned.

5 Claims, No Drawings

METHOD AND MATERIAL FOR CHECKING DRILLED PRINTED CIRCUIT BOARDS

BACKGROUND OF THE INVENTION

Printed circuit boards are widely used in the electronics industry for mounting and interconnecting various system components, such as integrated circuits, resistors, capacitors, inductors, and the like. Printed circuit boards are manufactured in a multi-step process, including a drilling step where holes for mounting of the system components are drilled in a preselected pattern on the board. As might be expected, precise location of the holes is critical, and even a single misaligned hole can render a board useless. Although the holes are typically drilled by numerically controlled drilling machines, power surges and other factors can sometimes affect drilling accuracy, and it is therefore necessary to check at least a statistical sampling of the boards.

The most common method for checking employs a master overlay sheet having the desired pattern of holes drilled in the sheet. By sandwiching the overlay and the printed circuit board together and holding the assemblage up to the light, an operator can detect misaligned holes by observing where the holes in the sheet and the board do not correspond. The printed circuit board may include thousands of drilled holes, and it is necessary to be able to consistently detect even a single misalignment. Moreover, it is imperative that the comparison time be minimized in order to reduce the cost of this quality check procedure.

Heretofore, master overlay sheets have been composed of a wide variety of materials, typically dimensionally stable translucent plastics. One such material, available from Polymer Plastics Corporation, assignee of the present application, has been sold under the trade name Trans-Chek. Trans-Chek is available in white, amber, and green, and it is composed of 0.01 inch polyvinyl chloride plastic sheets having a matte finish on both surfaces The green material, although generally functional, had a light transmissivity of less than 20% and has been found not to provide sufficient contrast between sheet material and the copper surface of the printed circuit board to enable operators to scan the printed circuit boards as rapidly as would be desirable.

For the above reasons, it would be desirable to provide improved plastic overlay materials for use in checking hole alignment on printed circuit boards.

SUMMARY OF THE INVENTION

According to the present invention, an improved master overlay material is used in checking the drilled hole pattern and printed circuit boards. The plastic overlay material has a blue-green or yellow-green color, light transmissivity in the range from about 25 to 40%, a thickness in the range from about 0.005 to 0.025 inches, and a matte finish on at least one surface. In the preferred embodiment, the transmissivity is about 30%, and the color has a Pantone® rating in one of the following ranges: 347-349; 354-356; and 361-363. The plastic material is dimensionally stable, and selected from the group of materials consisting of polyvinyl chloride, polyester, and polycarbonate. Preferably, the material is a polyvinyl chloride homopolymer. The material is used by first drilling the master pattern of holes in the plastic. By then holding the plastic up to the light together with a drilled printed circuit board, the hole alignment can be checked. Where holes are properly aligned, the light will simply pass through the aligned openings. Misaligned holes, in contrast, are detected by either of two circumstances. First, where a hole is absent in the printed circuit board, the bright copper finish of the printed circuit board will be visible through the hole in the overlay sheet. Second, where a hole is misaligned or an additional hole has been drilled, the plastic sheet material will be illuminated by light passing through the hole in the printed circuit board, resulting in a bright green spot which is easily detectable. The material is particularly useful since the green color of the plastic and the copper color of the printed circuit board, when sandwiched together, result in a very dark background on which the green, white and copper spots may be observed. Both the green color of the sheet and the copper color of the printed circuit board provide vivid contrast with this dark background.

DESCRIPTION OF THE PREFERRED EMBODIMENT

According to the present invention, master overlay sheets are composed of translucent, rigid plastic material which may be a homopolymer of a polyvinyl chloride, polyester, or polycarbonate, or the like. Polyvinyl chloride homopolymers are preferred because of economy and dimensional temperature stability.

Rigid plastic sheets may be formed from the polymeric resins by various well-known techniques. In particular, extrusion of the melted polymer through calendering machines has been found suitable. Calendering is accomplished by passing the melted polymer through opposed rollers until material of a suitable thickness is formed. Usually, the material will be passed through two or more pairs of rollers in series, with the final pair of rollers providing the desired thickness. The speed of passing the material through the calendering machine is critical; the speed must be sufficiently slow to that the material has time for stress relief in order to provide the high level of dimensional stability required by the present invention. The operating speed will vary depending on the machine utilized, and a suitable speed may be determined empirically by testing the resulting materials for dimensional stability, as described below.

The thickness of the material is not critical, although the material should be sufficiently thick to be rigid and sufficiently thin to allow light transmission within the parameters discussed below. Usually, the film will have a thickness in the range from about 0.005 to 0.025 inches, more usually in the range from about 0.05 to 0.015 inches, usually being about 0.01 inches.

It is also necessary that at least one of the surfaces of the plastic material be provided with a textured or matte finish. Smooth finishes cause a high degree of reflected light which is undesirable in the visual checking method of the present invention. The reflected light can mask or hide any copper and green spots (corresponding to misaligned holes) which may be present. The degree of texturing is not critical, although the texturing should be uniform across the entire surface of the plastic sheet and should be adequate to diffuse reflected light from the surface. In some cases, it may be desirable to texture both surfaces of the plastic sheet, and in other cases to provide a differing degree of texturing on each surface. By so doing, an operator can select the degree of texturing which best suits his desires.

It is also necessary that the plastic sheet material be dimensionally stable. Dimensional stability measured across the height and width of the plastic sheets must be within a tolerance of ±0.1%, preferably within ±0.01%. Such dimensional stability can be determined as follows. The plastic sheet material is cut into squares, typically 8 inches on a side. Precise dimensions are marked along the two orthogonal axes in the square using a permanent marking pen. After placing the material on a non-metal substrate, the substrate and material are placed in an environmental chamber cycling between 145° and 40° for approximately 3 days. After the test, the material is again measured along the same axes, and the new measurements compared with the initial measurements. Any differences should be within the tolerances just identified.

The two most important characteristics of the film are its color and light transmissivity. The color must be a blue-green or yellow-green, which has been found to provide maximum contrast with the copper surface of the printed circuit board. When the green overlay material is placed on the printed circuit board, the areas where the plastic overlays the copper are very dark, while the areas where plastic overlays a hole in the printed circuit board are bright green and areas where a hole in the overlay overly the printed circuit board are bright copper colored.

Particular colors which have been found most suitable for use in the present invention may be identified using the Pantone ® color matching system, Pantone, Inc., Moonachie, N.J. In particular, colors chosen from the following groupings have been found useful: 347-349; 354-356; and 361-363. Particularly preferred is color 354 which provides the optimum contrast.

Light transmissivity is also critical, and must be in the range from about 25 to 40%, preferably in the range from about 28 to 35%, more preferably being about 30%. Such light transmissivity is measured using the full visible spectrum using commercially available light transmissivity measurement systems. The Gardner XL-211 Hazegard hazemeter, available from Pacific Scientific, Silverspring, Maryland, is particularly suitable. The measurement system includes a light source in a light detector. Because of the light diffusing characteristics of the material of the present invention, the material must be placed directly against the light detector and the measurements made according to the manufacturer's instructions.

Although for foregoing invention has been described in some detail by way of illustration and example for purposes of clarity of understanding, it will be obvious that certain changes and modifications may be practiced within the scope of the appended claims.

What is claimed is:

1. A method for hole location in a drilled printed circuit board, said method employing a master overlay sheet having a pattern of holes corresponding to the desired pattern of holes in the printed circuit board and being composed of a plastic material characterized by:
    a thickness in the range from about 0.005 to 0.025 inches;
    a matte finish on at least one surface;
    a blue-green or yellow-green color; and
    a light transmissivity in the range from 25 to 40 percent;
    said method comprising:
    placing the master overlay sheet over the drilled printed circuit board; and
    visually comparing the alignment of holes in the overlay with holes in the printed circuit board, whereby the color and light transmissivity of the overlay provide a high contrast which enhances the detectability of misaligned holes.

2. A method as in claim 1, wherein the sheet color has a Pantone ® rating in one of the following ranges: 347-349; 354-356; and 361-363.

3. A method as in claim 1, wherein the sheet thickness is about 0.01 inches, the color rating is 354, and the light transmissivity is about 30 percent.

4. A method as in claim 1, wherein the sheet material is selected from the polymer vinyl group consisting of polyvinyl chloride, polyester, polycarbonate.

5. A method as in claim 4, wherein the sheet material is a polyvinyl chloride homopolymer.

* * * * *